United States Patent
Kim et al.

(10) Patent No.: US 12,453,983 B2
(45) Date of Patent: Oct. 28, 2025

(54) MANUFACTURING METHOD OF DISPLAY DEVICE AND MANUFACTURING DEVICE OF DISPLAY DEVICE

(71) Applicant: Samsung Display Co., LTD., Yongin-si (KR)

(72) Inventors: Jongsung Kim, Yongin-si (KR); Honggi Min, Yongin-si (KR); Sangjin Lee, Yongin-si (KR); Hee Jung Lee, Yongin-si (KR); Myungsoo Huh, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 12 days.

(21) Appl. No.: 18/406,431

(22) Filed: Jan. 8, 2024

(65) Prior Publication Data
US 2024/0286165 A1 Aug. 29, 2024

(30) Foreign Application Priority Data
Feb. 27, 2023 (KR) .......................... 10-2023-0026361

(51) Int. Cl.
*B05C 5/02* (2006.01)
*B05D 1/02* (2006.01)

(52) U.S. Cl.
CPC .............. *B05C 5/0291* (2013.01); *B05D 1/02* (2013.01)

(58) Field of Classification Search
None
See application file for complete search history.

(56) References Cited

U.S. PATENT DOCUMENTS

| 2010/0045731 | A1* | 2/2010 | Kim ..................... B41J 2/04561 347/19 |
| 2014/0184683 | A1* | 7/2014 | Harjee ................. B41J 2/04593 347/14 |

FOREIGN PATENT DOCUMENTS

KR 100901075 B1 6/2009

* cited by examiner

*Primary Examiner* — Michael P. Rodriguez
(74) *Attorney, Agent, or Firm* — CANTOR COLBURN LLP

(57) ABSTRACT

A manufacturing method of a display device includes forming a first droplet on a first region of a substrate by nozzles, moving the nozzles onto a second region of the substrate spaced apart in a first direction from the first region, forming a second droplet on the second region, calculating a first distance between the first and second droplets, moving the nozzles onto a third region of the substrate spaced apart in a direction opposite to the first direction from the second region, forming a third droplet on the third region, moving the nozzles onto a fourth region of the substrate spaced apart in the first direction from the third region, forming a fourth droplet on the fourth region, calculating a second distance between the third and the fourth droplets, and calculating a jetting velocity of each of the nozzles based on the first distance and the second distance.

9 Claims, 18 Drawing Sheets

MANUFACTURING METHOD OF DISPLAY DEVICE AND MANUFACTURING DEVICE OF DISPLAY DEVICE

This application claims priority to Korean Patent Application No. 10-2023-0026361, under 35 U.S.C. § 119, filed on Feb. 27, 2023, and all the benefits accruing therefrom under 35 U.S.C. § 119, the content of which in its entirety is herein incorporated by reference.

BACKGROUND

1. Field

Embodiments relate to a manufacturing method of a display device. More particularly, embodiments relate to a manufacturing method of a display device and a manufacturing device of the display device.

2. Description of the Related Art

A nozzle of inkjet printer head may form an ink droplet on a substrate. Printing quality of the inkjet printer may be determined by a characteristic value such as brightness of an image, sharpness, or the like. The characteristic value may be determined by a jetting characteristic.

The jetting characteristic may act as an important factor for verifying reliability of the inkjet printer. Accordingly, in general, the jetting characteristic of the inkjet printer head may be evaluated before performing a printing process.

SUMMARY

Embodiments provide a manufacturing method of a display device.

Embodiments provide a manufacturing device performing the manufacturing method of the display device.

A manufacturing method of a display device includes forming a first droplet on a first region of a substrate by a plurality of nozzles having a first separation distance from the substrate, moving the plurality of nozzles onto a second region of the substrate spaced apart in a first direction from the first region, forming a second droplet on the second region by the plurality of nozzles, calculating a first distance between the first droplet formed on the first region and the second droplet formed on the second region, moving the plurality of nozzles so that the plurality of nozzles has a second separation distance different from the first separation distance from the substrate, moving the plurality of nozzles onto a third region of the substrate spaced apart in a direction opposite to the first direction from the second region, forming a third droplet on the third region by the plurality of nozzles, moving the plurality of nozzles onto a fourth region of the substrate spaced apart in the first direction from the third region, forming a fourth droplet on the fourth region by the plurality of nozzles, calculating a second distance between the third droplet formed on the third region and the fourth droplet formed on the fourth region; and calculating a jetting velocity of each of the plurality of nozzles based on the first distance and the second distance.

In an embodiment, each of the first distance and the second distance may be calculated through photographing the substrate and obtaining positional information of the first to fourth droplets based on an image of the substrate.

In an embodiment, each of positional information of the first to fourth droplets may be obtained through storing image patterns of the first to fourth droplets and matching an image of the substrate and the image patterns.

In an embodiment, the jetting velocity of each of the plurality of nozzles may be calculated through calculating a first hit error satisfying Equation 1 when the plurality of nozzles having the first separation distance from the substrate, calculating a second hit error satisfying Equation 2 when the plurality of nozzles having the second separation distance from the substrate, and calculating the jetting velocity of each of the plurality of nozzles through Equation 3 based on the first hit error and the second hit error. The Equation 1 may be defined by:

$$DS_1 = (|F_{R1} - B_{R1}| - |F_{P1} - B_{P1}|)/2$$

where the $DS_1$ denotes the first hit error, the $|F_{R1}-B_{R1}|$ denotes the first distance, and the $|F_{P1}-B_{P1}|$ denotes the first input distance and a first input distance is defined between the first region and the second region when the droplets are formed without leaving the first region and the second region. The Equation 2 is defined by:

$$DS_2 = (|F_{R2} - B_{R2}| - |F_{P2} - B_{P2}|)/2$$

where the $DS_2$ denotes the second hit error, the $|F_{R2}-B_{R2}|$ denotes the second distance, and the $|F_{P2}-B_{P2}|$ denotes a second input distance and the second input distance is defined between the first region and the second region when the droplets are formed without leaving the first region and the second region. The Equation 3 is defined by:

$$V_N = H \cdot V_S / |DS_1 - DS_2|$$

where the $V_N$ denotes the jetting velocity of each of the plurality of nozzles, the H denotes a difference between the first separation distance and the second separation distance, the $V_S$ denotes a velocity at which the substrate moves in the first direction or the direction opposite to the first direction, and the $|DS_1-DS_2|$ denotes a difference between the first hit error and the second hit error.

In an embodiment, the method may further include storing a reference velocity before the forming the first droplet on the first region of the substrate.

In an embodiment, the method may further include comparing the jetting velocity of each of the plurality of nozzles and the reference velocity and detecting a defective nozzle having an abnormal velocity outside a predetermined range from the reference velocity among the plurality of nozzles.

In an embodiment, the detecting the defective nozzle may be performed before manufacturing the display device.

In an embodiment, the detecting the defective nozzle may be performed in real-time while manufacturing the display device.

In an embodiment, the method may further include processing the defective nozzle so that the defective nozzle is not used.

In an embodiment, at least one among the droplets may include a light-emitting material.

A manufacturing device of a display device includes a substrate including a first region, a second region spaced apart in a first direction from the first region, a third region spaced apart in an opposite direction to the first direction from the second region, and a fourth region spaced apart in the first direction from the third region, a stage which moves the substrate in the first direction or the opposite direction to the first direction, a plurality of nozzles which have a predetermined separation distance in a second direction crossing the first direction and form droplets on the substrate, a watcher which obtains images of the droplets on the substrate, and a calculator which calculates a jetting velocity of each of the plurality of nozzles based on a first distance and a second distance. The first distance is defined between a first droplet of the droplets formed on the first region and a second droplet of the droplets formed on the second region when the plurality of nozzles and the substrate have a first separation distance and the second distance is defined between a third droplet of the droplets formed on the third region and a fourth droplet of the droplets formed on the fourth region when the plurality of nozzles and the substrate have a second separation distance different from the first separation distance.

In an embodiment, the watcher may be a 2-dimension vision camera.

In an embodiment, the calculator may include a function of calculating a first hit error which satisfies Equation 1 when the plurality of nozzles has the first separation distance from the substrate, a function of calculating a second hit error which satisfies Equation 2 when the plurality of nozzles has the second separation distance from the substrate, and a function of calculating the jetting velocity of each of the plurality of nozzles through Equation 3 based on the first hit error and the second hit error. The Equation 1 is defined by:

$$DS_1 = (|F_{R1} - B_{R1}| - |F_{P1} - B_{P1}|)/2$$

where the $DS_1$ denotes the first hit error, the $|F_{R1}-B_{R1}|$ denotes the first distance, and the $|F_{P1}-B_{P1}|$ denotes a first input distance and the first input distance is defined between the first region and the second region when the droplets are formed without leaving the first region and the second region. The Equation 2 is defined by:

$$DS_2 = (|F_{R2} - B_{R2}| - |F_{P2} - B_{P2}|)/2$$

where the $DS_2$ denotes the second hit error, the $|F_{R2}-B_{R2}|$ denotes the second distance, and the $|F_{P2}-B_{P2}|$ denotes a second input distance and the second input distance is defined between the first region and the second region when the droplets are formed without leaving the first region and the second region. The Equation 3 is defined by:

$$V_N = H \cdot V_S / |DS_1 - DS_2|$$

where the $V_N$ denotes the jetting velocity of each of the plurality of nozzles, the H denotes a difference between the first separation distance and the second separation distance, the $V_S$ denotes a velocity at which the substrate moves in the first direction or the direction opposite to the first direction, and the $|DS_1-DS_2|$ denotes a difference between the first hit error and the second hit error.

In an embodiment, the manufacturing device may further include a first controller which stores a reference velocity of the plurality of nozzles.

In an embodiment, the manufacturing device may further include a second controller connected to each of the first controller and the calculator. The second controller may compare the jetting velocity of each of the plurality of nozzles provided by the first controller and the reference velocity provided by the calculator, and the calculator may detect a defective nozzle having an abnormal velocity outside a predetermined range from the reference velocity among the plurality of nozzles.

In an embodiment, the second controller may be connected to the plurality of nozzles, and the second controller may process the defective nozzle so that the defective nozzle is not used.

In an embodiment, the first controller and the second controller may be implemented as a same device.

In an embodiment, the second controller may detect the defective nozzle before manufacturing the display device.

In an embodiment, the second controller may detect the defective nozzle in real-time while manufacturing the display device.

In an embodiment, at least one among the droplets may include a light-emitting material.

By embodiments of the disclosure, a manufacturing method of a display device and a manufacturing device of the display device performing the method may remove a noise due to flatness by adjusting a separation distance between a plurality of nozzles and a substrate and observing a hit change. Accordingly, a jetting velocity of each of the plurality of nozzles may be more accurately measured.

In addition, in the manufacturing method and the manufacturing device, a constraint on the number of nozzles that may be observed may be reduced by observing the hit change after forming a droplet on the substrate. Accordingly, the jetting velocity of each of the plurality of nozzles may be more rapidly measured.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
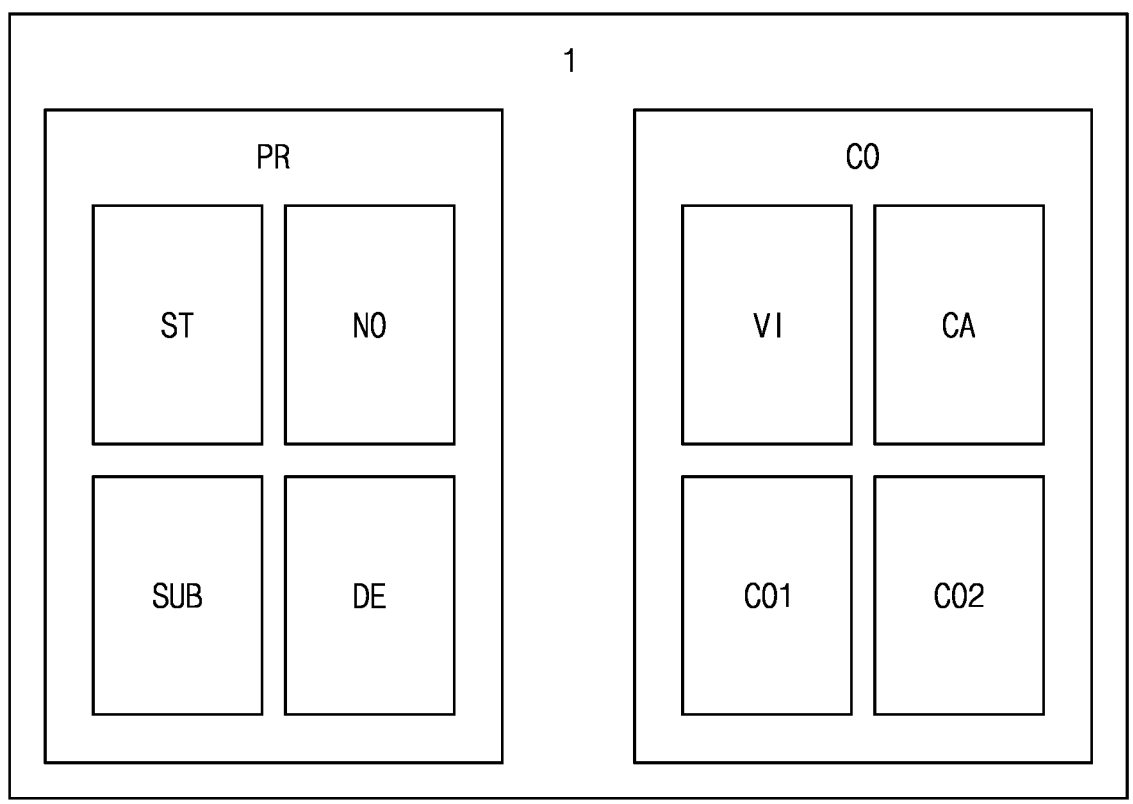
FIG. 1 is a block view illustrating an embodiment of a manufacturing device of a display device.

Hereinafter, embodiments will be described in more detail with reference to the accompanying drawings. The same reference numerals and/or reference characters are used for the same components in the drawings, and redundant descriptions of the same components will be omitted.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within +30%, 20%, 10%, 5% of the stated value, for example.

The term "controller" or "calculator" as used herein is intended to mean a software component or a hardware component that performs a predetermined function. The hardware component may include a field-programmable gate array ("FPGA") or an application-specific integrated circuit ("ASIC"), for example. The software component may refer to an executable code and/or data used by the executable code in an addressable storage medium. Thus, the software components may be object-oriented software components, class components, and task components, and may include processes, functions, attributes, procedures, subroutines, segments of program code, drivers, firmware, micro codes, circuits, data, a database, data structures, tables, arrays, or variables, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a block view illustrating an embodiment of a manufacturing device of a display device.

Referring to FIG. 1, a manufacturing device of a display device 1 in an embodiment may include a printing part PR and a defect inspection part CO.

In an embodiment, the printing part PR may include a stage ST, a substrate SUB, a plurality of nozzles NO, and a driving controller DE.

The substrate SUB may be seated on a top surface of the stage ST. The stage ST may further include a first driving device. The first driving device may drive the stage ST in a horizontal direction. In an embodiment, the first driving device may move the stage ST in a first direction DR1 (refer to FIG. 3) and/or a third direction DR3 (refer to FIG. 3), for example. Accordingly, an area to be printed on the substrate SUB may be adjusted. The third direction DR3 may cross the first direction DR1. In an embodiment, the third direction DR3 may be perpendicular to the first direction DR1, for example.

However, the disclosure is not limited thereto. In an embodiment, the first driving device may also drive the stage ST in the vertical direction, for example. In an embodiment, the first driving device may move the stage ST in a second direction DR2 (refer to FIG. 3), for example. Accordingly, a separation distance (e.g., a first separation distance H1 of FIG. 3 or a second separation distance H2 of FIG. 10) between the substrate SUB and the plurality of nozzles NO may be adjusted. The second direction DR2 may cross each of the first and third directions DR1 and DR3. In an embodiment, the second direction DR2 may be perpendicular to each of the first and third directions DR1 and DR3, for example.

The substrate SUB may be seated on the stage ST. The first driving device included in the stage ST may move the substrate SUB in the horizontal direction and/or a vertical direction. In an embodiment, the substrate SUB may be moved in the first direction DR1 or in a direction opposite to the first direction DR1, for example.

In an embodiment, the substrate SUB may be a substrate for inspection or a film for inspection, for example. The substrate SUB may have rigid or flexible characteristics. To this end, the substrate SUB may include a glass, a plastic, or the like.

The display device may include a plurality of light-emitting layers. When a discharge defect occurs in a process of forming the plurality of light-emitting layers, display quality of the display device may deteriorate. To prevent this, the manufacturing device of the display device 1 in an embodiment of the disclosure may inspect the discharge defect using the substrate SUB before manufacturing the display device. The substrate SUB may be a water-repellent film. Accordingly, a droplet may be formed on the substrate SUB.

However, the disclosure is not limited thereto. In an embodiment, the substrate SUB may be a substrate included in the display device, for example. In this case, the manufacturing device of the display device 1 may inspect the discharge defect in real-time while manufacturing the display device.

Figure 11:
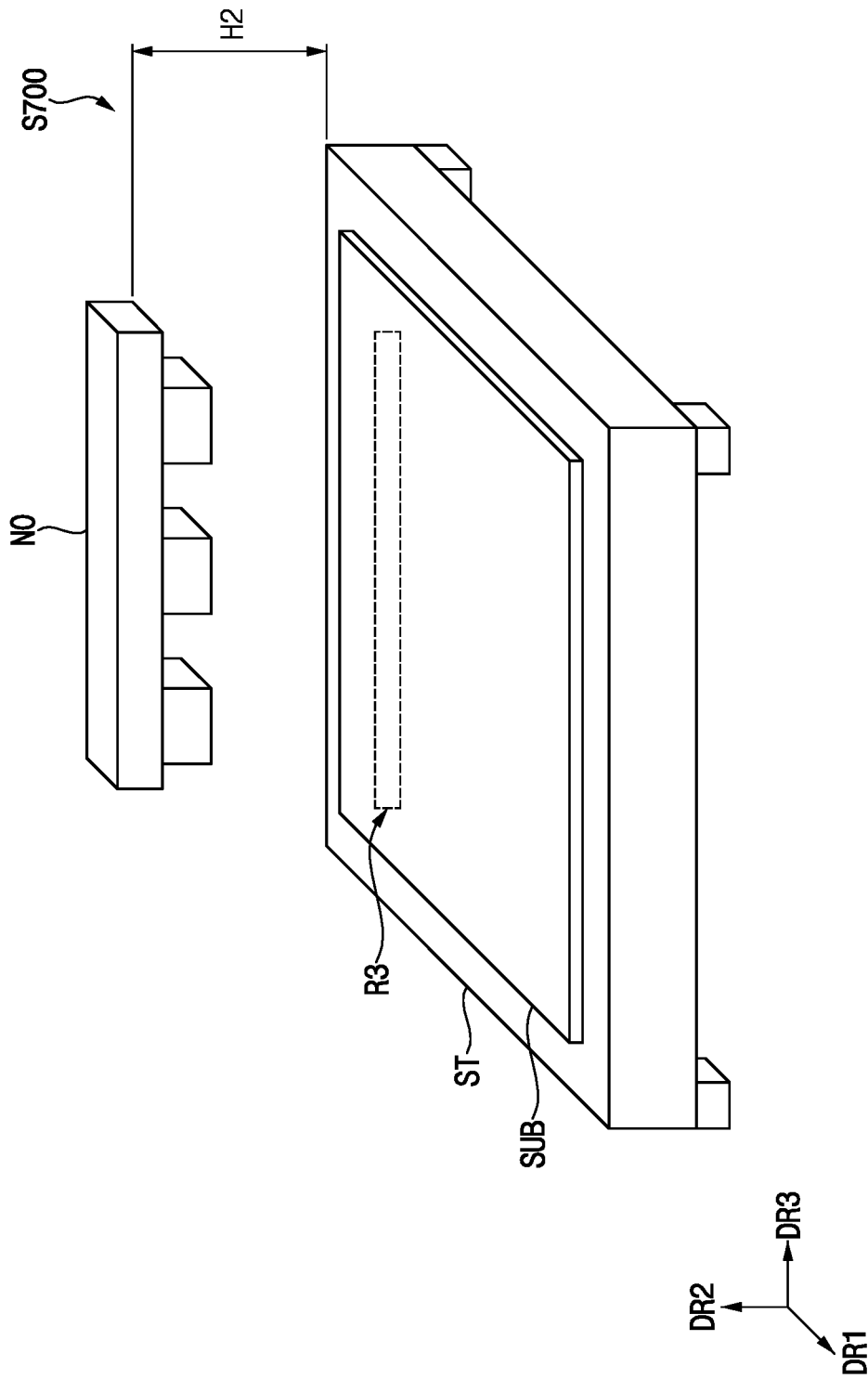
Figure 12:
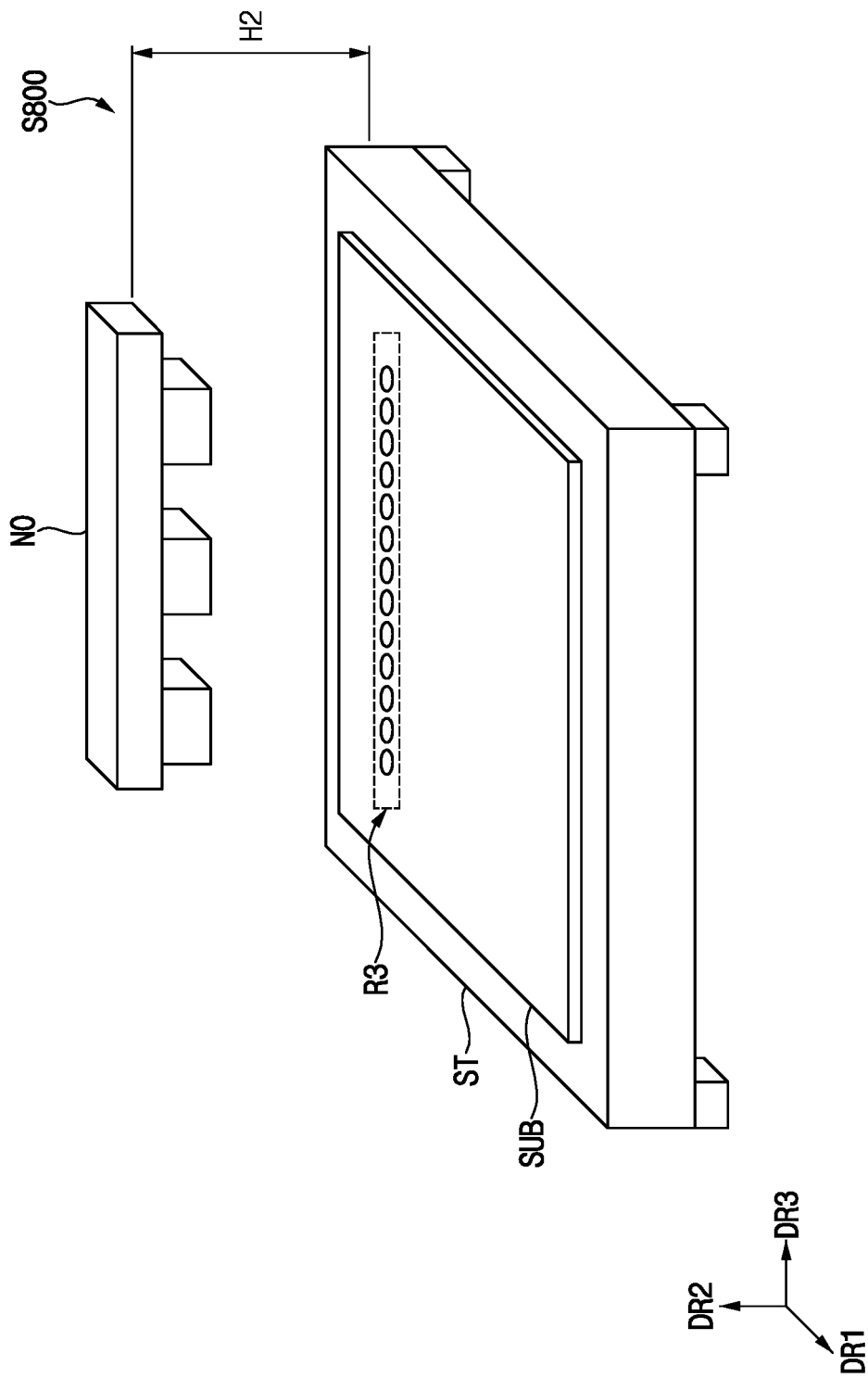
Figure 13:
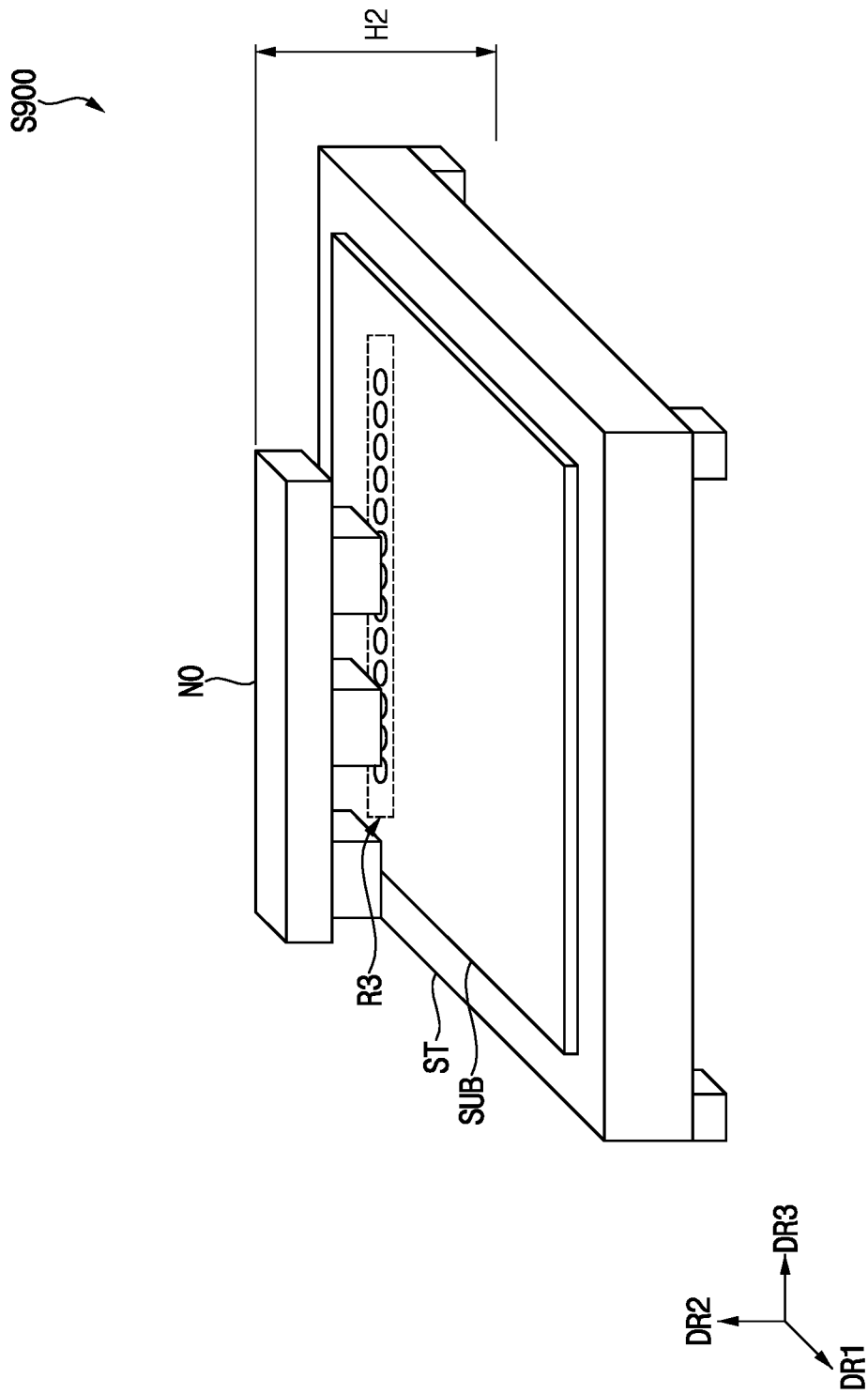
Figure 14:
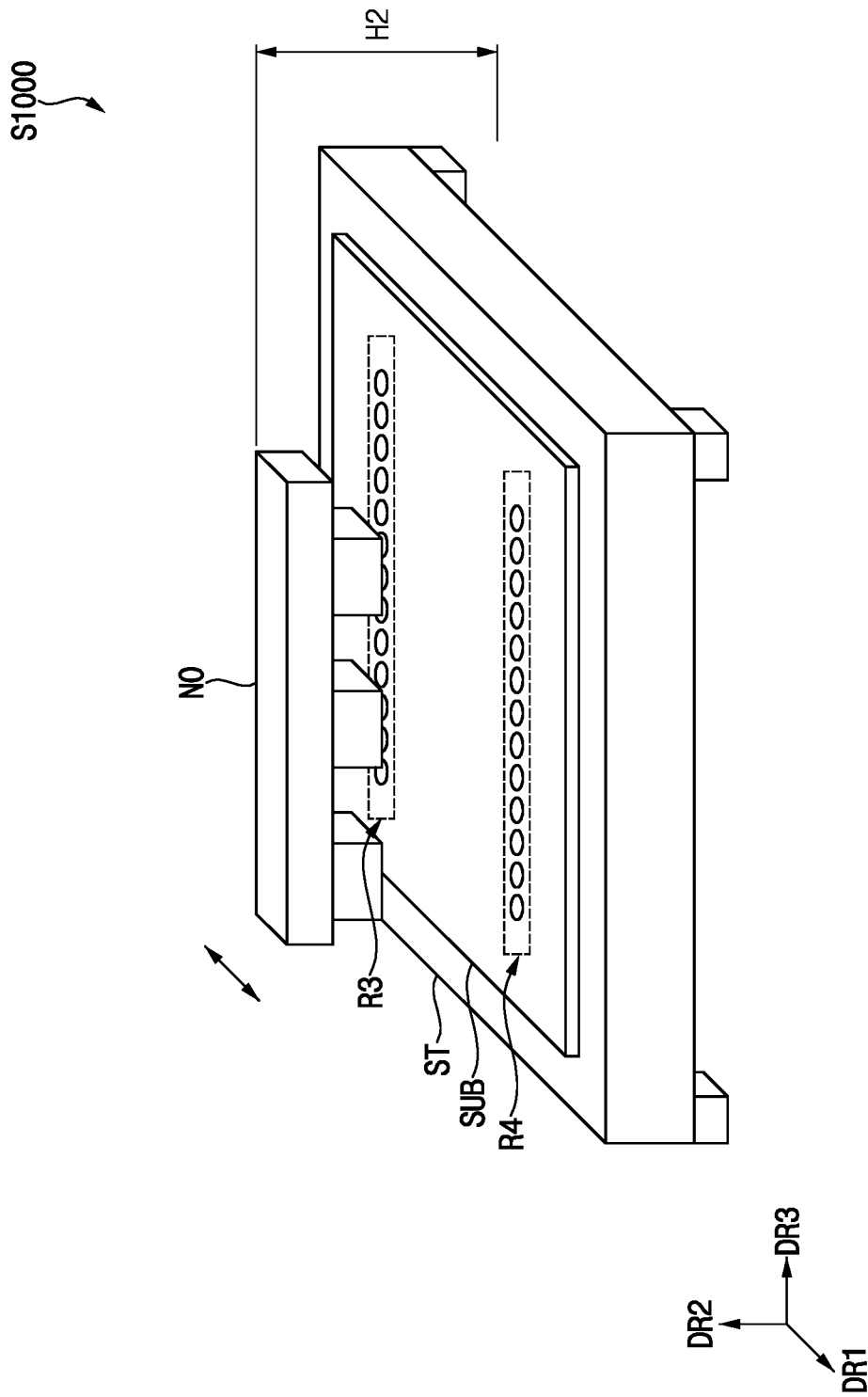
Figure 15:
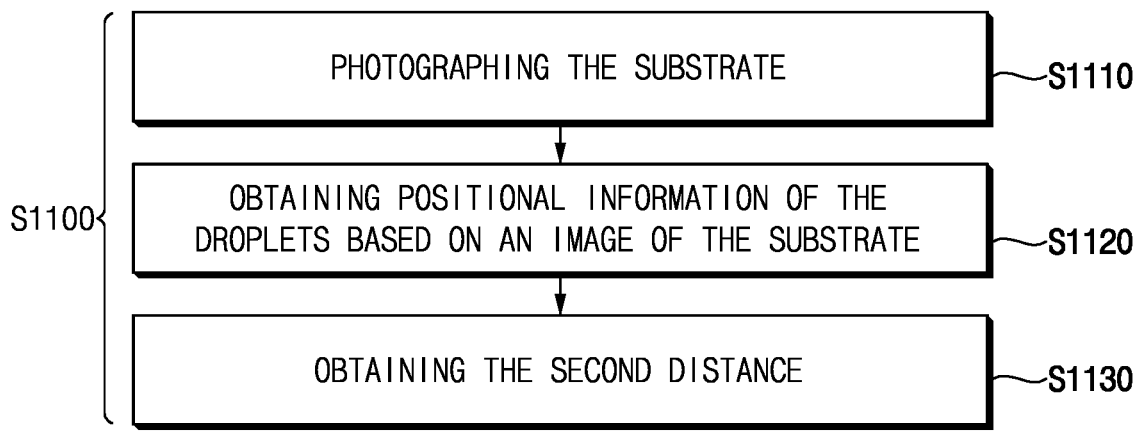
Figure 16:
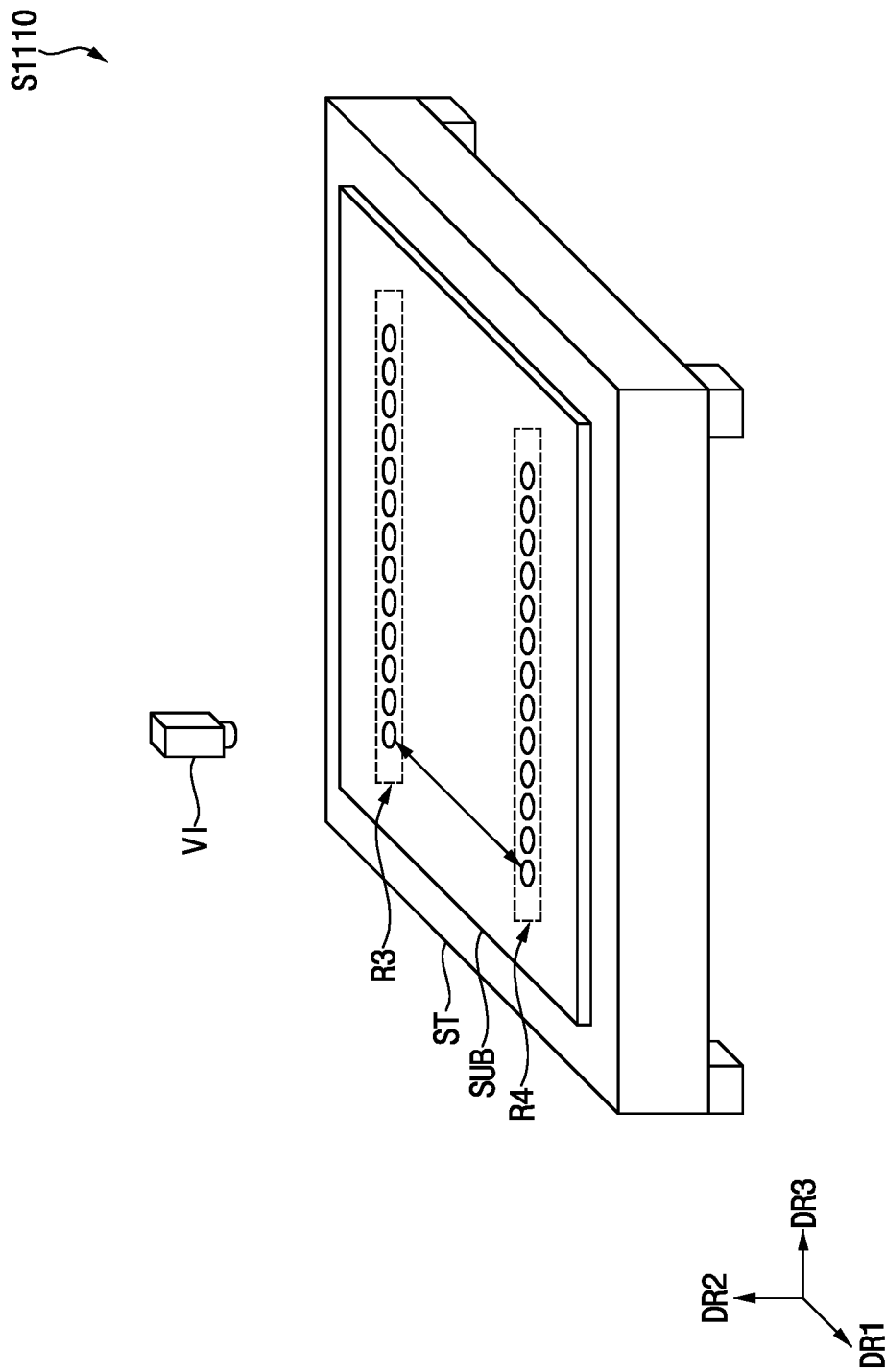
Figure 17:
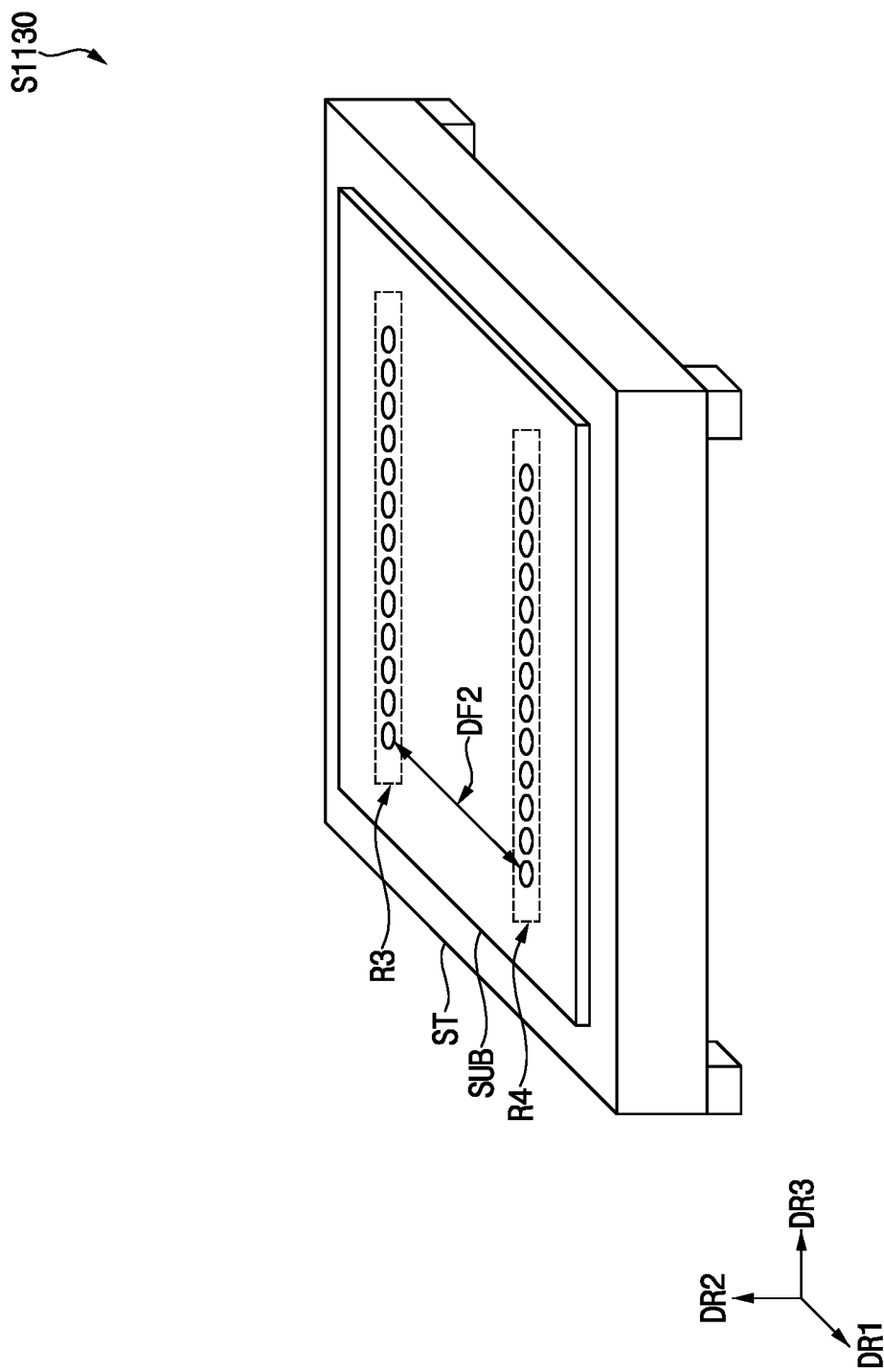
Figure 18:
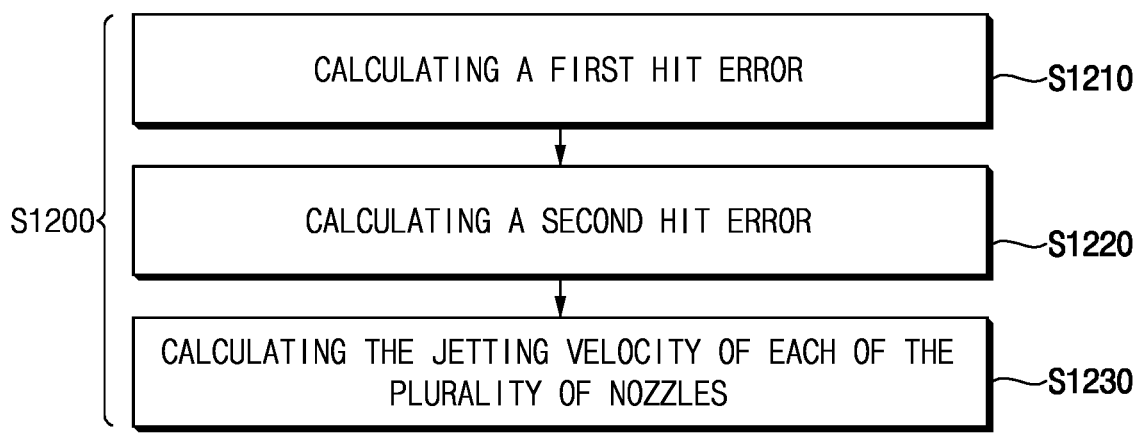

The substrate SUB may include a first region (a first region R1 of FIG. 3), a second region (a second region R2 of FIG. 4) spaced apart from the first region in the first direction DR1, a third region (a third region R3 of FIG. 11) spaced apart from the second region in the direction opposite to the first direction DR1, and a fourth region (a fourth region R4 of FIG. 13) spaced apart from the third region in the first direction DR1. A detailed description thereof will be described later in a manufacturing method 2 of the display device with reference to FIG. 2 and below.

Inkjet heads may be spaced apart from each other by a predetermined interval on the stage ST. The inkjet head may include the plurality of nozzles NO and a second driving device.

The plurality of nozzles NO may be disposed on a bottom surface of the inkjet head. Specifically, the plurality of nozzles NO may be spaced apart from the substrate SUB disposed on the stage ST in the second direction DR2. In an embodiment, discharge holes of the plurality of nozzles NO may be defined to be spaced apart from each other along the third direction DR3, for example. The discharge hole may refer to a hole through which ink is discharged toward the substrate SUB.

In an embodiment, the ink may include a light-emitting material. In an embodiment, the ink may include a quantum dot. In other words, the droplet formed on the substrate SUB may include the quantum dot, for example. However, the disclosure is not limited thereto. In an embodiment, the droplet may include various light-emitting materials, for example.

The number and arrangement of the nozzles included in the plurality of nozzles NO may be variously changed.

The second driving device may drive the inkjet head in the horizontal direction and/or in the vertical direction. Accordingly, the separation distance between the plurality of nozzles NO and the substrate SUB may be adjusted.

The driving controller DE may control the first driving device and the second driving device. In an embodiment, the driving controller DE may control a velocity, a movement path, driving time of each of the first driving device and the second driving device, or the like, for example. However, the disclosure is not limited thereto. In an embodiment, the manufacturing device of the display device 1 may include components for driving the substrate SUB in the horizontal direction and various components for driving the plurality of nozzles NO in the vertical direction, for example.

In an embodiment, the defect inspection part CO may include an observer VI, a calculator CA, a first controller CO1, and a second controller CO2.

The observer VI may obtain images of the droplets on the substrate SUB. That is, the observer VI may measure (observe) the droplets of a stationary state.

In an embodiment, the observer VI may be a two-dimensional ("2D") vision camera. In another embodiment, the observer VI may be a scanning camera. In an embodiment, the scanning camera may be a line scan camera, an area scan camera, or the like, for example. However, the disclosure is not limited thereto. In an embodiment, any device capable of measuring the droplets and acquiring positional information of the droplets may be used as the observer VI without limitation, for example.

In an embodiment, the calculator CA may include a function of calculating a first hit error, a function of calculating a second hit error, and a function of calculating the jetting velocity of each of the plurality of nozzles NO. A detailed description of the functions of the calculator CA will be described later with reference to FIG. 2 and below.

In an embodiment, the first controller CO1 may store a reference velocity of the plurality of nozzles NO. The reference velocity may be defined as a standard velocity for determining whether each of the plurality of nozzles NO is in a normal discharge state.

The normal discharge state may mean a state in which the jetting velocity of each of the plurality of nozzles NO satisfies a predetermined range from the reference velocity.

An abnormal discharge state may mean a state in which a nozzle having a jetting velocity out of the predetermined range from the reference velocity exists among the jetting velocity of the plurality of nozzles NO. That is, the abnormal discharge state may mean a state in which a nozzle having a jetting velocity that does not permit printing exists.

In an embodiment, the second controller CO2 may be connected to each of the first controller CO1, the calculator CA, and the plurality of nozzles NO. The second controller CO2 may include a function of detecting a defective nozzle. Specifically, the second controller CO2 may include a function of comparing the jetting velocity of each of the plurality of nozzles NO with the reference velocity, a function of detecting the defective nozzle having an abnormal velocity outside a predetermined range from the reference velocity, and a function of processing the defective nozzle not to be used. A detailed description of the functions of the second controller CO2 will be described with reference to FIG. 2 and below.

In an embodiment, the second controller CO2 may detect the defective nozzle before manufacturing the display device, and process the defective nozzles not to be used. As the defective nozzles are processed not to be used before the manufacturing the display device, a rate of occurrence of a defect in the display device may be improved.

In another embodiment, the second controller CO2 may detect the defective nozzle in real-time while manufacturing the display device, and process the defective nozzles not to be used. As the defective nozzles are processed not to be used before in real-time while manufacturing the display device, the display quality of the display device may be improved.

However, the disclosure is not limited thereto. In an embodiment, the second controller CO2 may reset the jetting velocity of the defective nozzle, for example.

In an embodiment, the first controller CO1 and the second controller CO2 may be implemented as a same device. In an embodiment, the first controller CO1 and the second controller CO2 may be embedded in a same program, for example. However, the disclosure is not limited thereto. In another embodiment, the first controller CO1 and the second controller CO2 may be implemented as different devices, programs, systems, or the like.

A manufacturing device of the display device according to a comparative embodiment may include a drop watcher. The drop watcher may observe the inks of a dynamic state. Specifically, the drop watcher may measure the jetting velocity from images photographing the ink discharged from the plurality of nozzles NO with a time delay. The drop watcher may measure only about several to several tens of the plurality of nozzles NO. Accordingly, observing time about thousands of nozzles NO may take about several to about several tens of days.

In a case of manufacturing device of the display device 1 according to the disclosure, the observer VI may observe the droplets of the stationary state. Specifically, the jetting velocity (e.g., a jetting velocity $V_N$ of FIG. 19) may be calculated from positional information of the droplets of the stationary state. Accordingly, observing time of the jetting velocity of about thousands of nozzles NO may take about several to about several tens of minutes.

In addition, the jetting velocity calculated by the manufacturing device of the display device 1 in an embodiment of the disclosure may exhibit a strong quantitative correlation with the jetting velocity measured by the manufacturing device of the display device according to the comparative embodiment. Specifically, Pearson correlation coefficient ("PCC") appears may be about 0.7 to about 1.

In other words, the jetting velocity calculated by the manufacturing device of the display device 1 in an embodiment of the disclosure may have the strong quantitative linear correlation with the jetting velocity measured by the manufacturing device of the display device according to the comparative embodiment, and the manufacturing device of the display device 1 in an embodiment of the disclosure may calculate the jetting velocity more rapidly than the manufacturing device of the display device according to the comparative embodiment.

Figure 2:
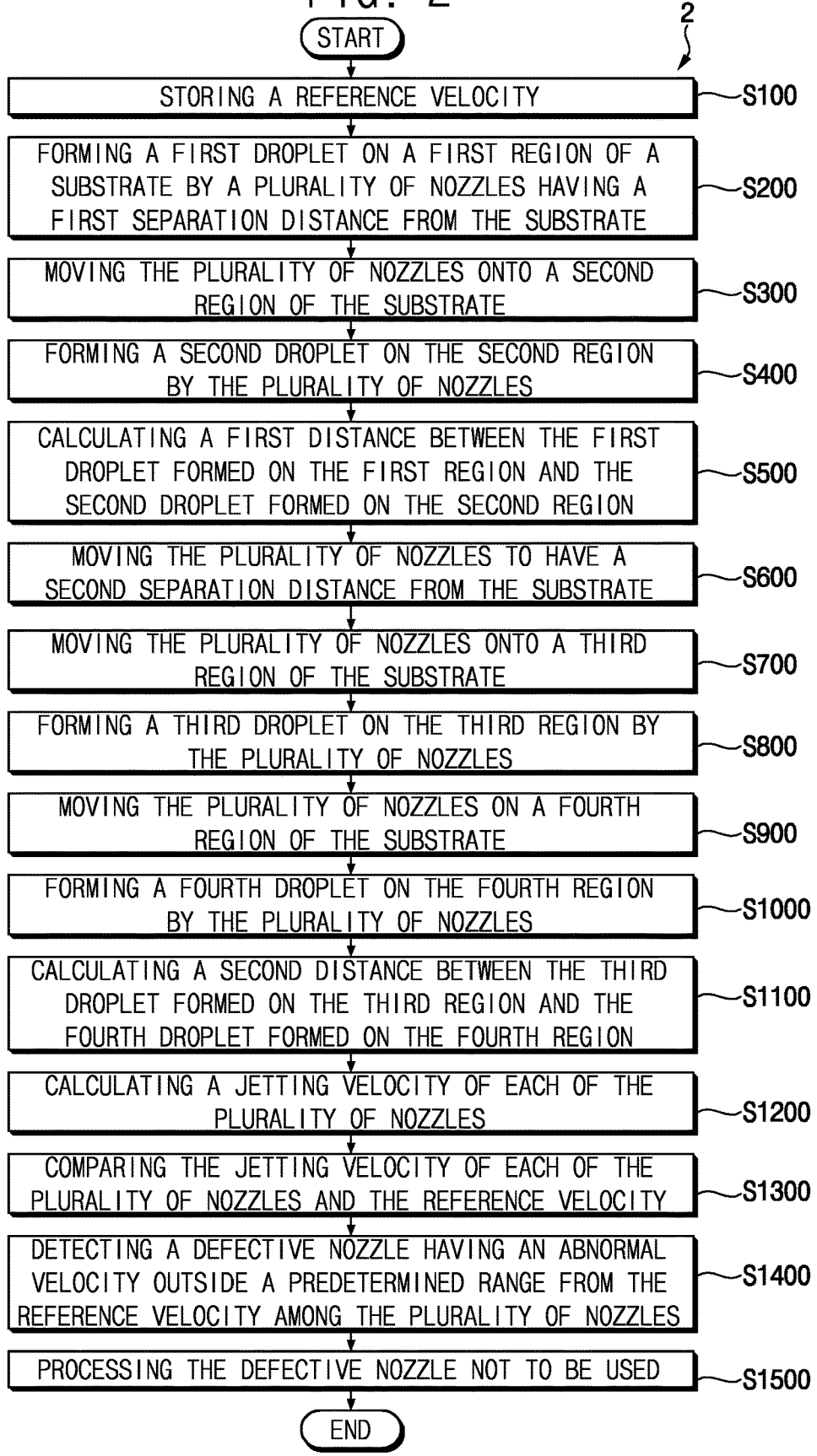
FIG. 2 is a flow chart illustrating an embodiment of a manufacturing method of a display device.

FIG. 2 is a flow chart illustrating an embodiment of a manufacturing method of a display device. FIGS. 3, 4, 5, 6, 7, 8, 9, 10, 11, 12, 13, 14, 15, 16, 17, 18, and 19 are views illustrating the manufacturing method of the display device of FIG. 2.

Figure 19:
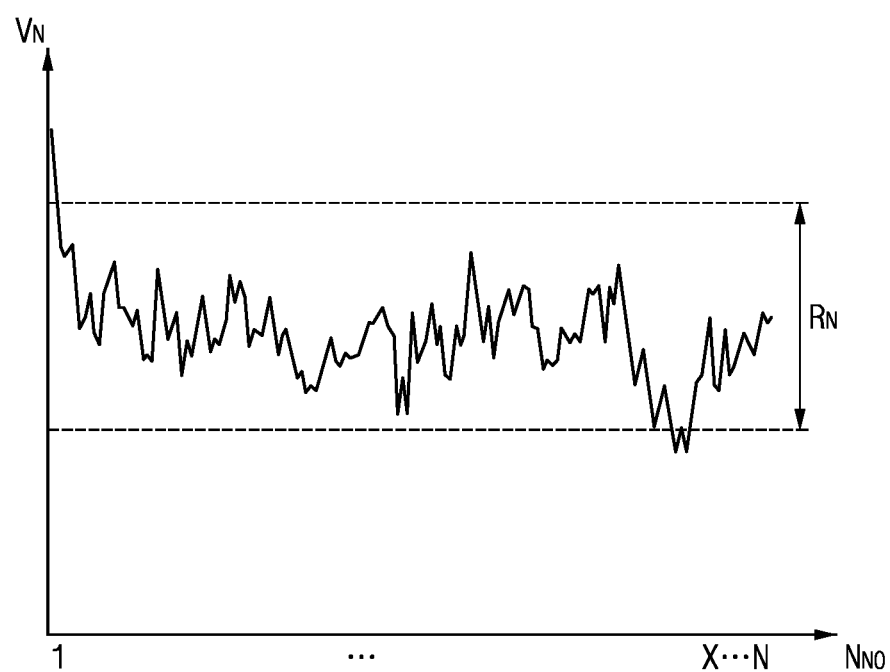

Specifically, FIG. 2 is a flow chart illustrating the manufacturing method 2 of the display device, and FIGS. 3, 4, 5, 6, 7, 8, 9, 10, 11, 12, 13, 14, 15, 16, 17, and 18 are perspective views illustrating the manufacturing method 2 of the display device of FIG. 2, for example. FIG. 19 is a graph illustrating an operation of detecting a defective nozzle included in the manufacturing method 2 of the display device of FIG. 2. Hereinafter, descriptions overlapping with those of the manufacturing device of the display device 1 described above with reference to FIG. 1 will be omitted or simplified.

Referring to FIGS. 1 and 2, the method 2 manufacturing of the display device in an embodiment of the disclosure may include storing a reference velocity (S100).

In an embodiment, the reference velocity may be stored in the first controller CO1. As described above, the reference velocity may be a pre-stored value for determining the abnormal velocity in an operation of detecting the defective nozzle.

Figure 3:
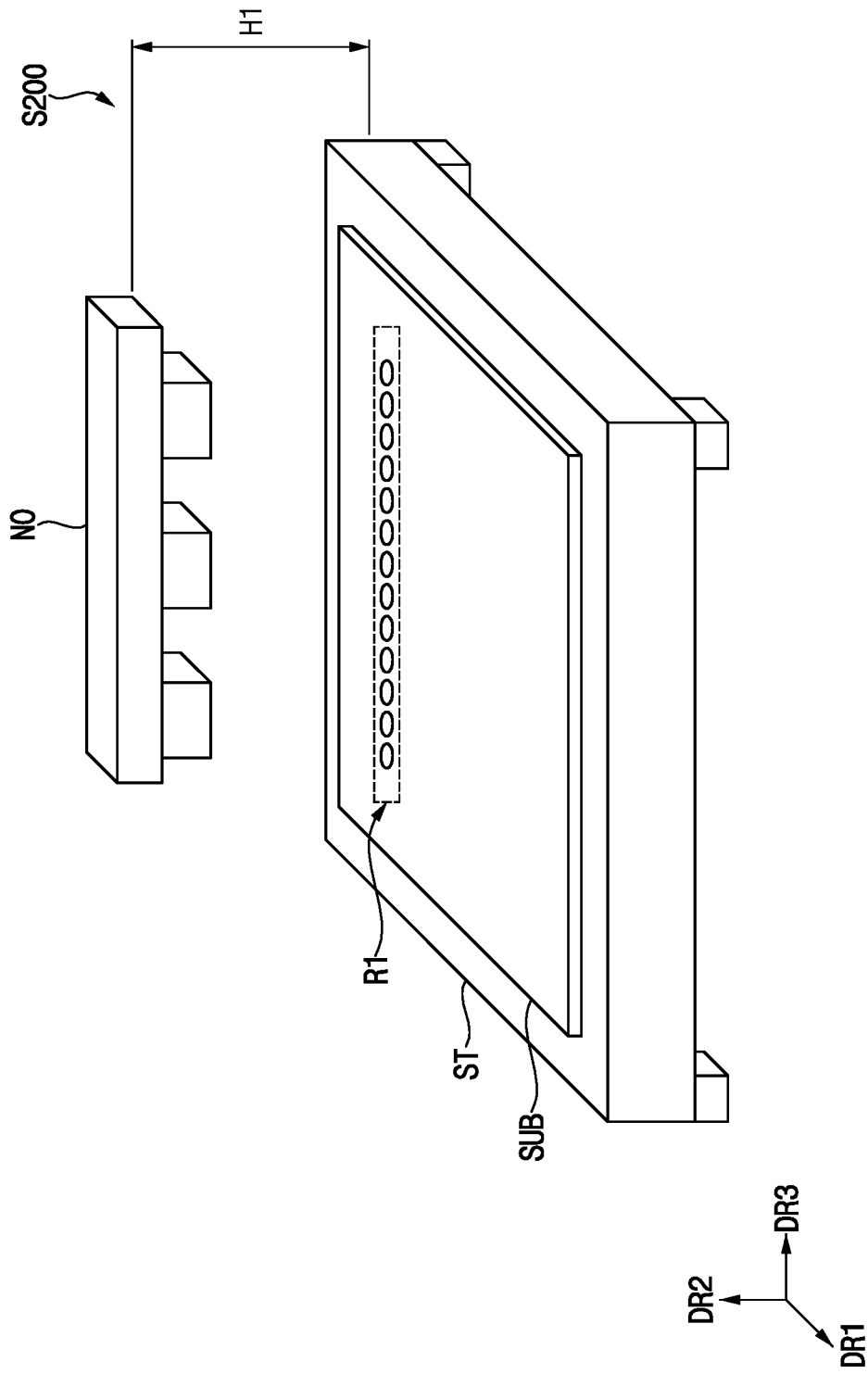
FIGS. 3, 4, 5, 6, 7, 8, 9, 10, 11, 12, 13, 14, 15, 16, 17, 18, and 19 are views illustrating an embodiment of the manufacturing method of the display device of FIG. 2.
Figure 4:
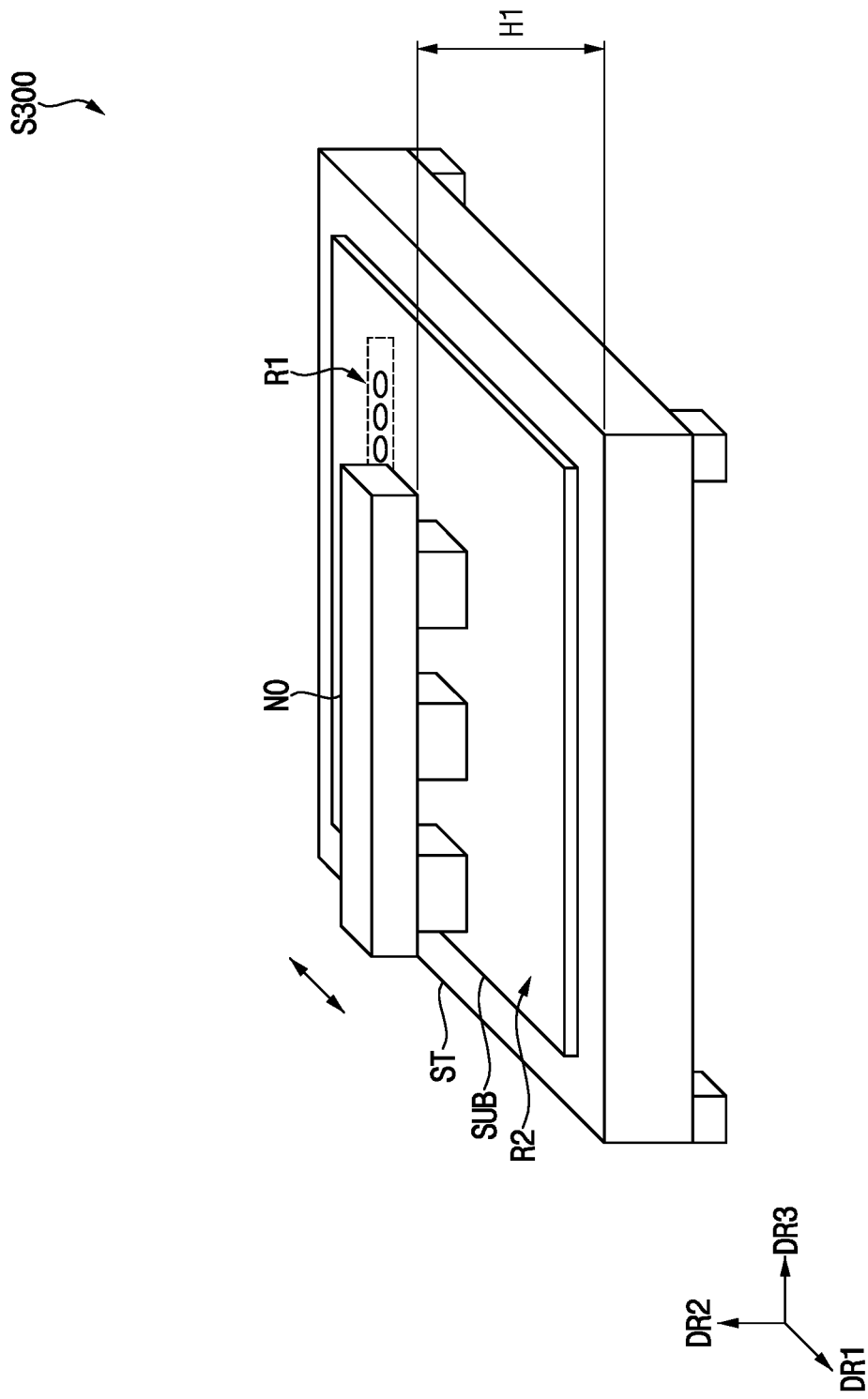
Figure 5:
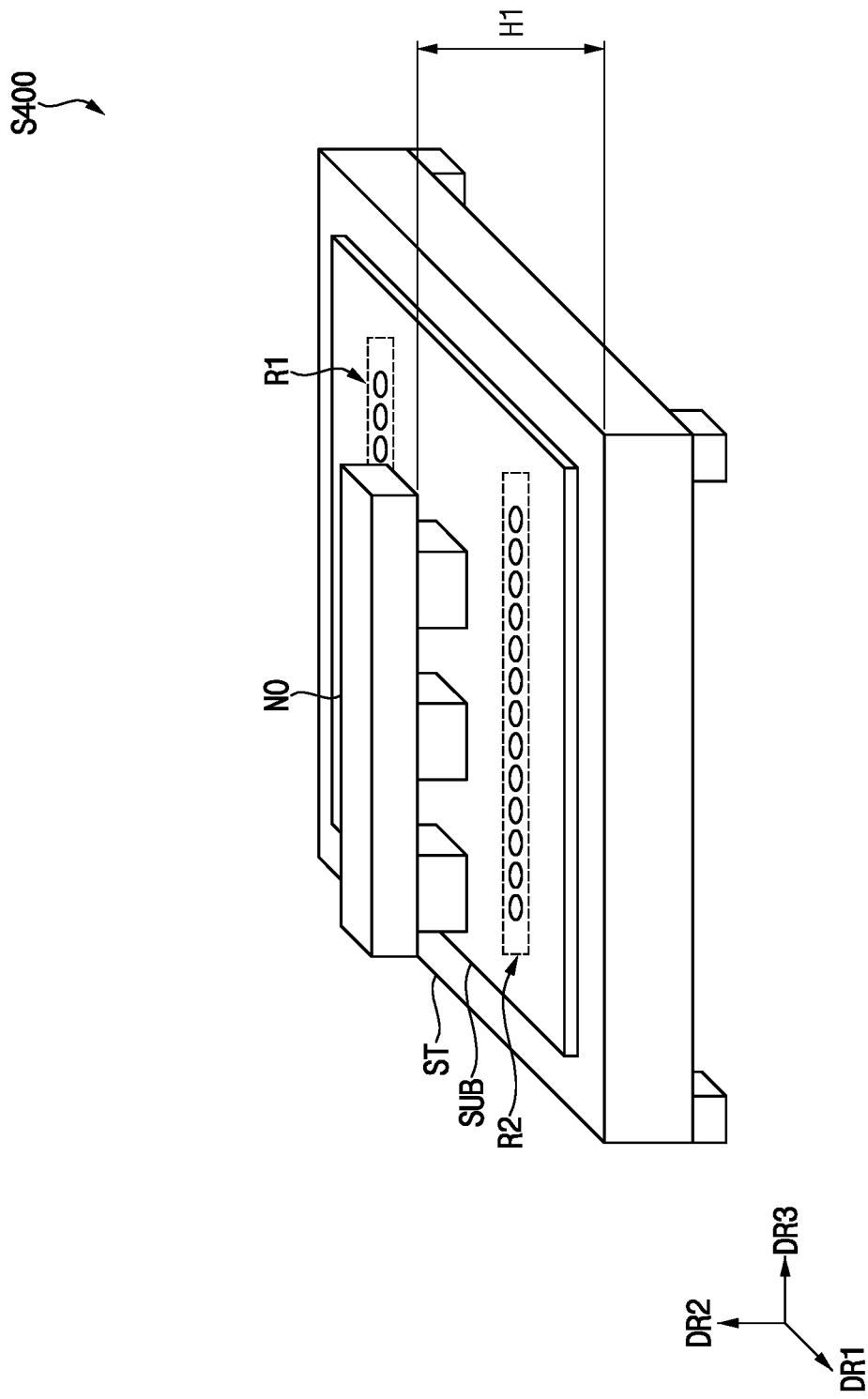

Referring to FIGS. 1, 2, and 3, the plurality of nozzles NO having the first separation distance H1 from the substrate SUB may form a first droplet on the first region R1 of the substrate SUB (S200).

As described above, the substrate SUB may be the water-repellent film for inspect the discharge defect or may be the substrate included in the display device being manufactured.

The substrate SUB may be seated on the stage ST. The stage ST may move the substrate SUB in the horizontal direction (e.g., the first direction DR1 and/or the third direction DR3) and/or the vertical direction (e.g., the second direction DR2). Accordingly, a position where the droplet is formed may be adjusted.

Referring to FIGS. 1, 2, 4, and 5, the plurality of nozzles NO may be moved onto the second region R2 of the substrate SUB (S300). Next, the plurality of nozzles NO may form the droplet on the second region R2 (S400).

The second region R2 may be spaced apart from the first region R1 in the first direction DR1. In an embodiment, the first region R1 may be adjacent to a first side of the substrate SUB and the second region R2 may be adjacent to a second side opposite to the first side of the substrate SUB, for example.

When the plurality of nozzles NO has the jetting velocity that satisfy the predetermined range from the reference velocity, the first droplet may be disposed in the first region R1 and the second droplet may be disposed in the second region R2.

When the defective nozzle having the jetting velocity outside the predetermined range (i.e., the abnormal velocity) exists among the plurality of nozzles NO, the droplets may be disposed outside the first region R1 and/or the second region R2. In other words, when the defective nozzle has the abnormal velocity higher than the jetting velocity, the defective nozzle may form the droplets onto a position where the position more adjacent to the first side of the substrate from the first region R1 and/or a position where the position more adjacent to the second side of the substrate form the second region R2. When the defective nozzle has the abnormal velocity lower than the jetting velocity, the droplets may be formed between the first region R1 and the second region R2.

In an embodiment, at least one among the droplets may include the light-emitting material. In an embodiment, the droplet may include the quantum dot, for example.

The defective nozzle may form the droplet the position where the position outside the first region R1 and/or the second region R2. In this case, the droplet may be formed at a position where the position outside a light-emitting region.

When the droplet does not exist in the light-emitting region, the light-emitting region might not emit light. When the number of liquid droplets in the light-emitting region exceeds a preset amount, the light-emitting region may deviate from a resonance thickness and the display quality such as a decrease in light efficiency or the like may deteriorate.

The manufacturing method 2 of the display device in an embodiment of the disclosure may detect the defective nozzle and process the defective nozzle not to be used. Accordingly, the display quality of the display device may be improved and the occurrence rate of the defect may be reduced. Detailed description about this will be described in below.

Referring to FIGS. 1, 2, 6, 7, 8, and 9, a first distance DF1 between the first droplet formed on the first region R1 and the second droplet formed on the second region R2 may be calculated (S500).

In an embodiment, the calculating of the first distance DF1 (S500) may include photographing the substrate SUB (S510), obtaining the positional information of the droplets based on an image of the substrate SUB photographed, and obtaining the first distance DF1 (S530).

Figure 6:
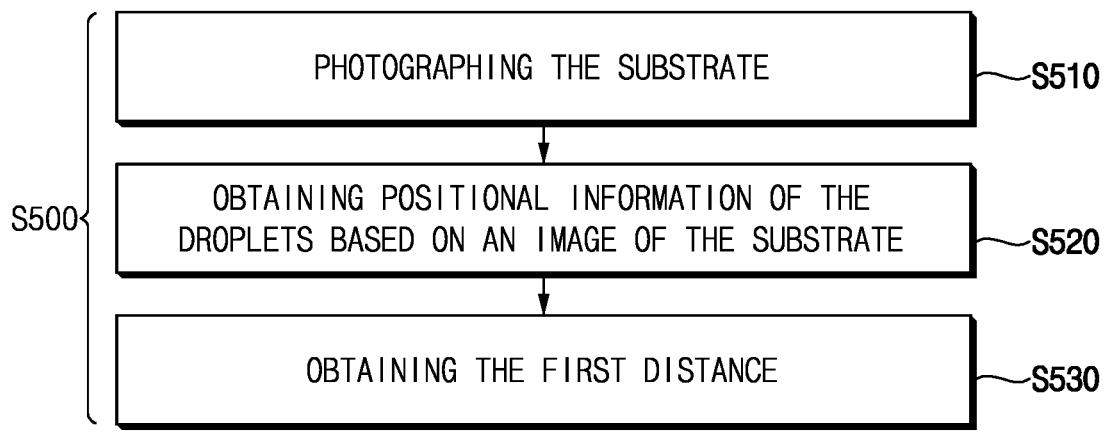
Figure 7:
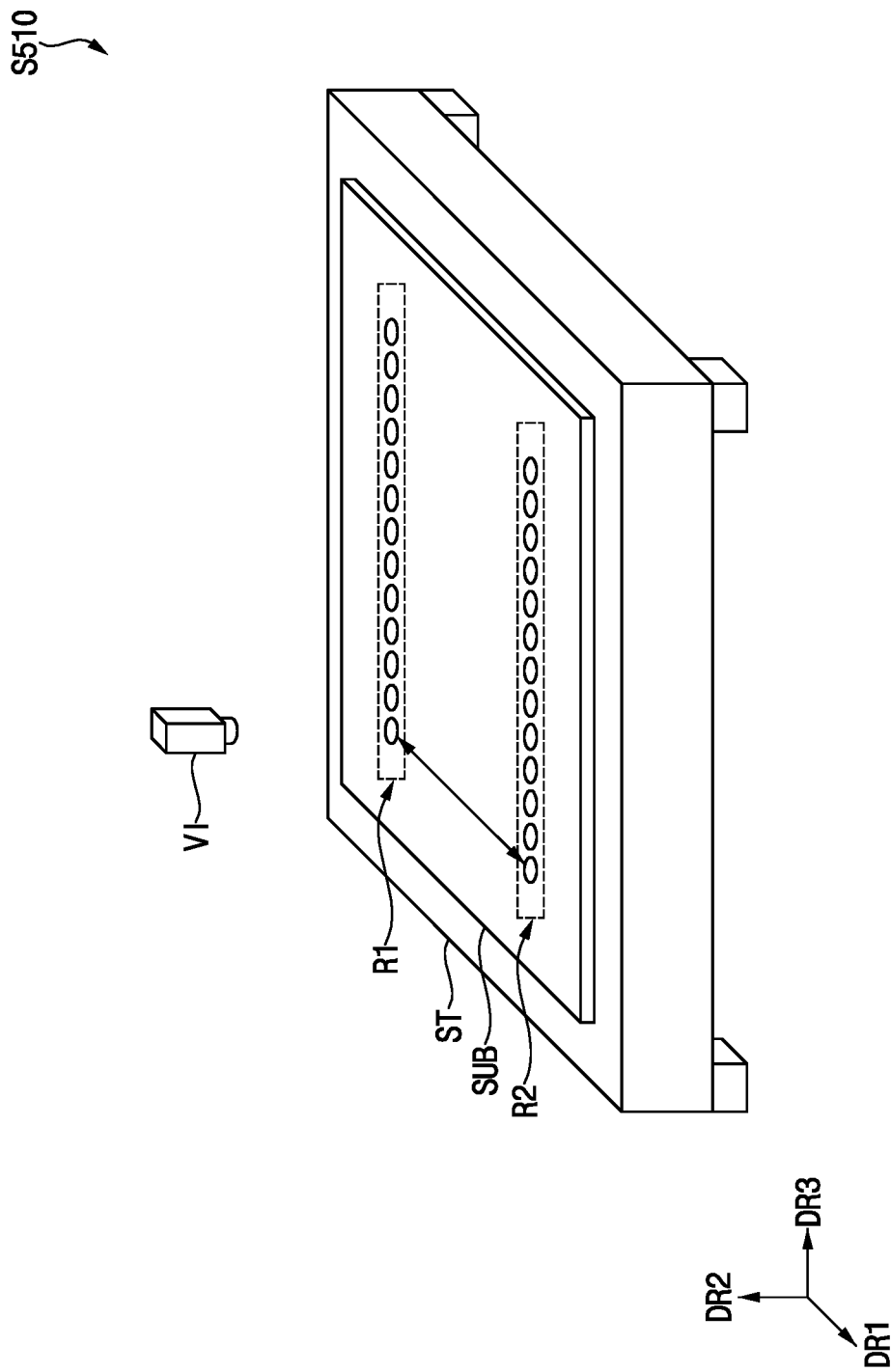
Figure 8:
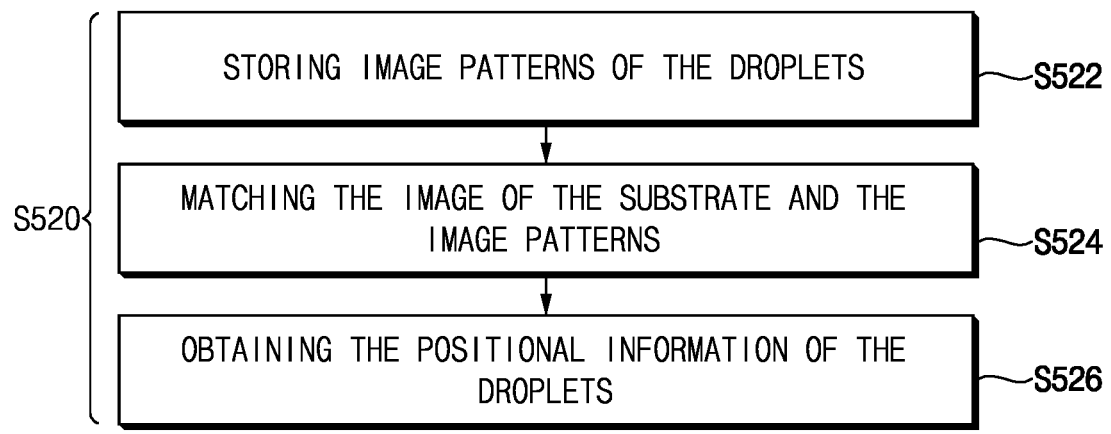
Figure 9:
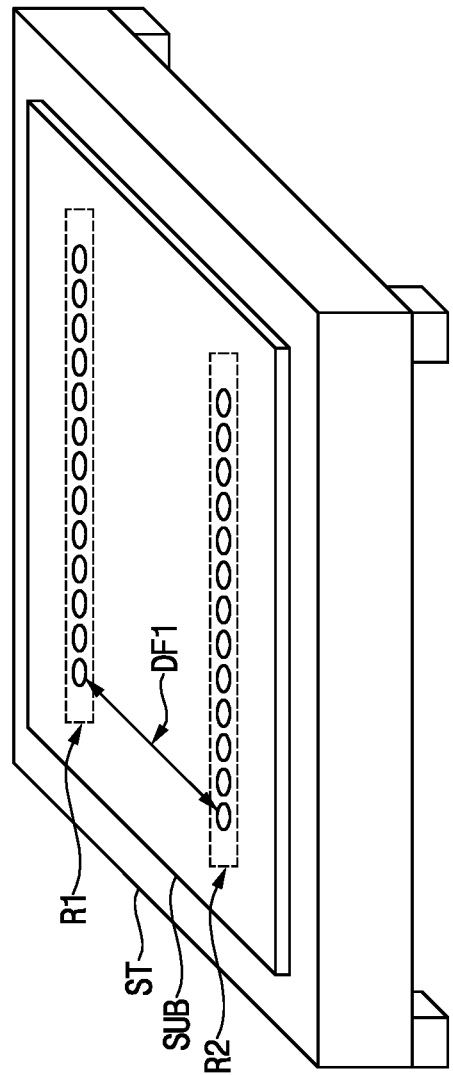

For convenience of explanation, a third driving device for driving the observer VI is omitted in FIG. 6. In an embodiment, the third driving device may be implemented as a same device as the second driving device driving the plurality of nozzles NO, for example. In an alternative embodiment, the third driving device may be implemented as a different device from the second driving device.

In an embodiment, the obtaining of the positional information of the droplets based on the image of the substrate SUB (S520) may include storing image patterns of the droplets (S522), matching the image and the image patterns (S524), and obtaining the positional information of the droplets (S526).

In a plan view, (e.g., a plane defined by the first direction DR1 and the third direction DR3), the image patterns of the droplets may have various shapes. In an embodiment, the image patterns may have various planar shapes such as a sphere, an ellipse, or the like, for example.

The substrate SUB may have various sizes. Accordingly, the image may be obtained in a variety of ways. In an embodiment, when the size of the substrate SUB is small, the image may be an image of an entirety of the substrate SUB, for example. In another embodiment, when the size of the substrate SUB is large, the image may be an image obtained by connecting images obtained by scanning the substrate SUB in a panoramic form. However, the disclosure is not limited thereto. In an embodiment, the image of the substrate SUB may be obtained in various ways, for example.

The image of the substrate SUB may be matched with the image patterns. In an embodiment, only the region where the droplet is formed on the substrate SUB may be set as a region of interest ("ROI"). Next, a presence or absence of the droplet may be determined using grayscale data of the ROI, for example. However, the disclosure is not limited thereto. In an embodiment, the area of the droplets on the substrate SUB may be obtained in various ways, for example.

When the droplet exists, the positional information of each droplets may be obtained through a positional difference from a preset reference point to the droplet. In an embodiment, the reference point may be set to one vertex of the substrate SUB, for example. However, the disclosure is not limited thereto. The reference point may be set at various positions according to a printing direction. In addition, the positional information of the droplets may be obtained in various ways.

The first distance DF1 may be defined as the distance between the first droplet formed on the first region R1 and the second droplet formed on the second region R2. The first distance DF1 may be calculated for each droplets formed by each of the plurality of nozzles NO. That is, the first distance DF1 may be calculated by the number of the plurality of nozzles NO.

Figure 10:
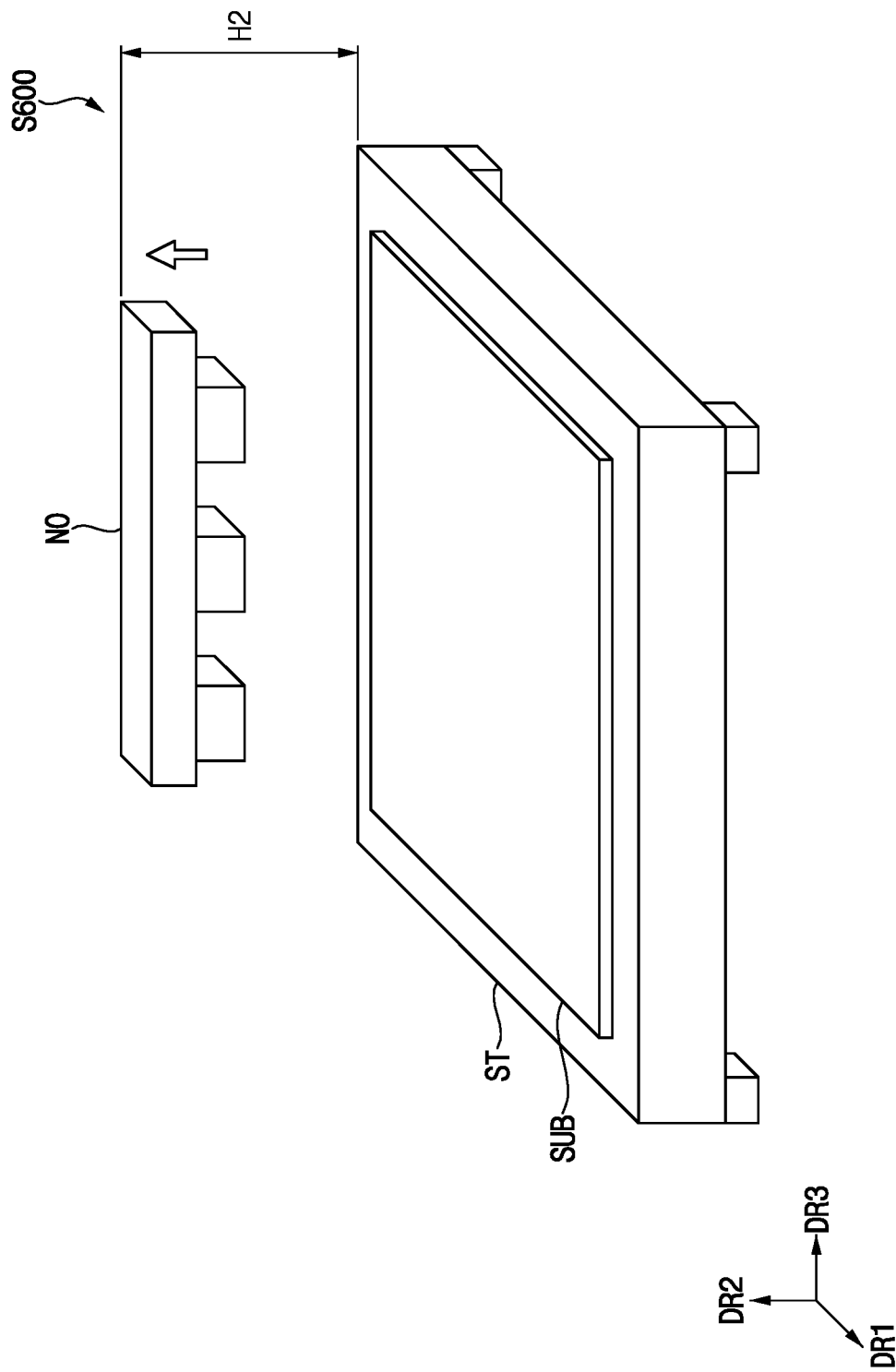

Referring to FIGS. 1, 2, and 10, the plurality of nozzles NO may be moved so that the plurality of nozzles NO has the second separation distance H2 from the substrate SUB (S600). The second separation distance H2 may be different from the first separation distance H1.

Referring to FIGS. 1, 2, 11, and 12, the plurality of nozzles NO may be moved onto the third region R3 of the substrate SUB (S700). Next, the plurality of nozzles NO may form the third droplet on the third region R3 (S800).

The third region R3 may be spaced apart from the second region R2 in the direction opposite to the first direction DR1. In an embodiment, the third region R3 may be disposed at a same position as the first region R1. However, the disclosure is not limited thereto. In another embodiment, the third region R3 may be disposed at a different position from that of the first region R1.

Referring to FIGS. 1, 2, 13, and 14, the plurality of nozzles NO may be moved onto the fourth region R4 of the substrate SUB (S900). Next, the plurality of nozzles NO may form the fourth droplet on the fourth region R4 (S1000).

The fourth region R4 may be spaced apart from the third region R3 in the direction first direction DR1. In an embodiment, the fourth region R4 may be disposed at a same position as the second region R2. However, the disclosure is not limited thereto. In another embodiment, the fourth region R4 may be disposed at a different position from that of the second region R2.

Referring to FIGS. 1, 2, 15, 16, 17, and 18, the second distance DF2 between the third droplet formed on the third region R3 and the fourth droplet formed on the fourth region R4 may be calculated (S1100).

In an embodiment, the calculating of the second distance DF2 (S1100) may include the photographing of the substrate SUB (S1110), obtaining the positional information of the droplets based on the image of the substrate SUB photographed. (S1120), and obtaining the second distance DF2 (S1130).

As described above with reference to FIG. 8, the obtaining of the positional information of the droplets based on the image of the substrate SUB (S1120) may include the storing of the image patterns of the droplets, matching the image of the substrate SUB and the image patterns, and the obtaining of the positional information of the droplets.

The second distance DF2 may be defined as the distance between the third droplet formed on the third region R3 and the fourth droplet formed on the fourth region R4. The second distance DF2 may be calculated by the number of the plurality of nozzles NO.

As described above, when the defective nozzle exists among the plurality of nozzles NO, abnormal values may be found in the first distance DF1 and the second distance DF2. The abnormal value may be larger or smaller than the preset value.

Referring to FIGS. 1, 2, 9, 17, and 18, the jetting velocity of each of the plurality of nozzles NO based on the first distance DF1 and the second distance DF2 (e.g., the jetting velocity $V_N$ of FIG. 19) may be calculated (S1200).

In an embodiment, the jetting velocity of each of the plurality of nozzles NO may be determined by calculating the first hit error (S1210), calculating the second hit error (S1220), and calculating the jetting velocity of each of the plurality of nozzles NO satisfying Equation 3 below based on the first hit error and the second hit error (S1230).

The first hit error may satisfy Equation 1 below. The first hit error may be obtained based on when the substrate SUB and the plurality of nozzles NO have the first separation distance H1.

$$DS_1 = (|F_{R1} - B_{R1}| - |F_{P1} - B_{P1}|)/2 \qquad \langle\text{Equation 1}\rangle$$

(in Equation 1, the $DS_1$ denotes the first hit error, the $|F_{R1}-B_{R1}|$ denotes the first distance, and the $|F_{P1}-B_{P1}|$ denotes a first input distance)

The first input distance ($|F_{P1}-B_{P1}|$) may be the measured value. The first distance may correspond the first distance DF1 of FIG. 9.

The first input distance may be an ideal value. The first input distance may mean the distance difference between the first region R1 and the second region R2, when the droplets are formed without leaving the first region R1 and the second region R2.

The second hit error may satisfy Equation 2 below. The second hit error may be obtained based on a case where the substrate SUB and the plurality of nozzles NO have the second separation distance H2.

$$DS_2 = (|F_{R2} - B_{R2}| - |F_{P2} - B_{P2}|)/2 \qquad \langle\text{Equation 2}\rangle$$

(in Equation 2, the $DS_2$ denotes the second hit error, the $|F_{R2}-B_{R2}|$ denotes the second distance, and the $|F_{P2}-B_{P2}|$ denotes a second input distance)

The second input distance may be the measured value. The second distance may correspond the second distance DF2 of FIG. 17.

The second input distance may be an ideal value. The second input distance may mean the distance difference between the third region R3 and the fourth region R4, when the droplets are formed without leaving the third region R3 and the fourth region R4.

As shown in Equation 1 and Equation 2, each of the first hit error and the second hit error may be the ideal value (i.e., plan data) to confirm a deviation of the jetting velocity for each nozzle from an intended jetting velocity for each nozzle) and the measured value (i.e., real data). In addition, since the deviation includes information in both directions, the deviation may be divided by two (2) to determine the deviation in one direction.

The jetting velocity of each of the plurality of nozzles NO may satisfy Equation 3 below. Specifically, the jetting velocity of each of the plurality of nozzles NO may be calculated based on the first hit error and the second hit error.

$$V_N = H \cdot V_S / |DS_1 - DS_2| \qquad \langle \text{Equation 3} \rangle$$

(In Equation 3, the $V_N$ denotes the jetting velocity of each of the plurality of nozzles, the H denotes a difference between the first separation distance and the second separation distance, the $V_S$ denotes a velocity at which the substrate moves in the first direction or the direction opposite to the first direction, and the $|DS_1-DS_2|$ denotes a difference between the first hit error and the second hit error)

In the above, it has been described that the substrate SUB moves only in the first direction DR1, or in the direction opposite to the first direction DR1. However, the disclosure is not limited thereto. In an embodiment, after forming the droplet once on the substrate SUB, the substrate SUB may be moved in the third direction DR3 and the droplet may be formed once again, for example. In this case, the $V_S$ in Equation 3 may be a velocity at which the substrate SUB moves in the third direction DR3 or in a direction opposite to the third direction DR3.

In the above, it has been described that the stage ST on which the substrate SUB is seated is moved. However, the disclosure is not limited thereto. In an embodiment, the inkjet head in which the plurality of nozzles NO are disposed may be moved, for example. In this case, the $V_S$ in Equation 3 may be a moving velocity of the inkjet head.

Referring to FIGS. 1, 2, and 19, the jetting velocity of each of the plurality of nozzles NO may be compared with the reference velocity (S1300), detecting the defective nozzle (e.g. a first nozzle or a X nozzle) having the abnormal velocity outside a predetermined range $R_N$ from the reference velocity (S1400), and processing the defective nozzle not to be used (S1500).

In FIG. 19, X-axis represents the number $N_{NO}$ of each of the plurality of nozzles NO, and Y-axis represents the jetting velocity $V_N$ of each of the plurality of nozzles NO.

As described above, when the jetting velocity $V_N$ of each of the plurality of nozzles NO satisfies the predetermined range $R_N$ from the reference velocity, it may be determined that the plurality of nozzles NO is in the normal discharge state. The predetermined range $R_N$ may vary depending on an equipment, a process parameter, a desired quality level, or the like.

When any one of the jetting velocities $V_N$ of each of the plurality of nozzles NO deviates from the reference velocity within the predetermined range $R_N$ (i.e., when having the abnormal velocity), the nozzle having the abnormal velocity (i.e., the defective nozzle) may be determined to be in the abnormal discharge state.

In an embodiment, the first nozzle and the X nozzle of FIG. 19 may be the defective nozzles, for example. The jetting velocity $V_N$ of the first nozzle exceeds the predetermined range $R_N$ from the reference velocity, and the jetting velocity $V_N$ of the X nozzle falls short of the reference velocity within the predetermined range $R_N$. As described above, the defective nozzle may form the droplet at the position outside the light-emitting area. Accordingly, the defect may occur in the display device.

In the manufacturing method 2 of the display device according to the disclosure, the defective nozzle may be detected (S1400), and the defective nozzle may be processed not to be used (S1500). Accordingly, the manufacturing method 2 of the display device in an embodiment of the disclosure may improve the display quality of the display device and reduce the occurrence rate of the defect.

In an embodiment, the detecting of the defective nozzle (S1400) may be performed before the manufacturing of the display device. In other words, the defective nozzle may be detected and unused before the manufacturing of the display device. In another embodiment, the detecting of the defective nozzle (S1400) may be performed in real-time while the manufacturing of the display device. In other words, while the display device is being manufactured, the defective nozzle may be detected in real-time and may be processed not to be used. Accordingly, the occurrence of the defect due to the defective nozzle may be prevented.

The manufacturing method 2 of the display device described above with reference to FIGS. 2 to 19 may contribute to a production of a good product by calculating the jetting velocity at relatively high velocity, detecting the defective nozzle having the abnormal velocity, and processing the defective nozzle not to be used.

The manufacturing method of the display device and the manufacturing display of the display device in embodiments of the disclosure may be applied to manufacturing the display device. In an embodiment, the display device may include a computer, a notebook, a cell phone, a smart phone, a smart pad, a portable media player ("PMP"), a personal digital assistance ("PDA"), a motion pictures expert group audio layer III ("MP3") player, or the like, for example.

The above description is an embodiment of technical features of the disclosure, and those skilled in the art to which the disclosure pertains will be able to make various modifications and variations. Therefore, the embodiments of the disclosure described above may be implemented separately or in any combinations with each other. Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed:

1. A manufacturing method of a display device, the method comprising:

forming a first droplet on a first region of a substrate by a plurality of nozzles having a first separation distance from the substrate;

moving the plurality of nozzles onto a second region of the substrate spaced apart in a first direction from the first region;

forming a second droplet on the second region by the plurality of nozzles;

calculating a first distance between the first droplet formed on the first region and the second droplet formed on the second region;

moving the plurality of nozzles so that the plurality of nozzles has a second separation distance different from the first separation distance from the substrate;

moving the plurality of nozzles onto a third region of the substrate spaced apart in a direction opposite to the first direction from the second region;

forming a third droplet on the third region by the plurality of nozzles;

moving the plurality of nozzles onto a fourth region of the substrate spaced apart in the first direction from the third region;

forming a fourth droplet on the fourth region by the plurality of nozzles;

calculating a second distance between the third droplet formed on the third region and the fourth droplet formed on the fourth region; and calculating a jetting velocity of each of the plurality of nozzles based on the first distance and the second distance, wherein the jetting velocity of each of the plurality of nozzles is calculated through:

calculating a first hit error satisfying Equation 1 when the plurality of nozzles having the first separation distance from the substrate;

calculating a second hit error satisfying Equation 2 when the plurality of nozzles having the second separation distance from the substrate; and calculating the jetting velocity of each of the plurality of nozzles through Equation 3 based on the first hit error and the second hit error, wherein the Equation 1 is defined by:

$$DS_1 = (|F_{R1} - B_{R1}| - |F_{P1} - B_{P1}|)/2$$

where the $DS_1$ denotes the first hit error, the $|F_{R1} - B_{R1}|$ denotes the first distance, and the $|F_{P1} - B_{P1}|$ denotes a first input distance and the first input distance is defined between the first region and the second region when the first and second droplets are formed without leaving the first region and the second region, the Equation 2 is defined by:

$$DS_2 = (|F_{R2} - B_{R2}| - |F_{P2} - B_{P2}|)/2$$

where the $DS_2$ denotes the second hit error, the $|F_{R2} - B_{R2}|$ denotes the second distance, and the $|F_{P2} - B_{P2}|$ denotes a second input distance and the second input distance is defined between the third region and the fourth region when the third and fourth droplets are formed without leaving the third region and the fourth region), and the Equation 3 is defined by $$V_N = H \cdot V_S / |DS_1 - DS_2|$$

where the $V_N$ denotes the jetting velocity of each of the plurality of nozzles, the H denotes a difference between the first separation distance and the second separation distance, the $V_S$ denotes a velocity at which the substrate moves in the first direction or the direction opposite to the first direction, and the $|DS_1 - DS_2|$ denotes a difference between the first hit error and the second hit error).

2. The method of claim 1, wherein each of the first distance and the second distance is calculated through,
photographing the substrate; and
obtaining positional information of the first to fourth droplets based on an image of the substrate.

3. The method of claim 1, wherein each of positional information of the first to fourth droplets is obtained through,
storing image patterns of the first to fourth droplets; and
matching an image of the substrate and the image patterns.

4. The method of claim 1, further comprising:
storing a reference velocity before the forming the first droplet on the first region of the substrate.

5. The method of claim 4, further comprising:
comparing the jetting velocity of each of the plurality of nozzles and the reference velocity; and
detecting a defective nozzle having an abnormal velocity outside a predetermined range from the reference velocity among the plurality of nozzles.

6. The method of claim 5, wherein the detecting the defective nozzle is performed before manufacturing the display device.

7. The method of claim 5, wherein the detecting the defective nozzle is performed in real-time while manufacturing the display device.

8. The method of claim 5, further comprising:
processing the defective nozzle so that the defective nozzle is not used.

9. The method of claim 1, wherein at least one among the first, second, third and fourth droplets includes a light-emitting material.

* * * * *